(12) United States Patent
Hiyoshi et al.

(10) Patent No.: US 11,282,925 B2
(45) Date of Patent: Mar. 22, 2022

(54) SILICON CARBIDE SEMICONDUCTOR DEVICE

(71) Applicant: Sumitomo Electric Industries, Ltd., Osaka (JP)

(72) Inventors: Toru Hiyoshi, Osaka (JP); Takashi Tsuno, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 16/771,797

(22) PCT Filed: Oct. 2, 2018

(86) PCT No.: PCT/JP2018/036896
§ 371 (c)(1),
(2) Date: Jun. 11, 2020

(87) PCT Pub. No.: WO2019/116684
PCT Pub. Date: Jun. 20, 2019

(65) Prior Publication Data
US 2020/0373392 A1    Nov. 26, 2020

(30) Foreign Application Priority Data
Dec. 15, 2017 (JP) .............................. JP2017-240856

(51) Int. Cl.
*H01L 29/16* (2006.01)
*H01L 29/423* (2006.01)
*H01L 29/78* (2006.01)

(52) U.S. Cl.
CPC ...... *H01L 29/1608* (2013.01); *H01L 29/4236* (2013.01); *H01L 29/7813* (2013.01)

(58) Field of Classification Search
CPC ............ H01L 29/1608; H01L 29/4236; H01L 29/7813
(Continued)

(56) References Cited

U.S. PATENT DOCUMENTS

2002/0190313 A1* 12/2002 Takaishi .............. H01L 29/7808
257/330
2006/0214242 A1   9/2006 Carta et al.
(Continued)

FOREIGN PATENT DOCUMENTS

JP   2002-373988 A   12/2002
JP   2006-310782 A   11/2006
(Continued)

*Primary Examiner* — Igwe U Anya
(74) *Attorney, Agent, or Firm* — Baker Botts L.L.P.; Michael A. Sartori

(57) ABSTRACT

A silicon carbide semiconductor device has a gate insulating film, a first gate electrode, a first electrode, a second electrode, and a gate runner. A silicon carbide substrate has a first main surface and a second main surface. The silicon carbide substrate includes a first impurity region, a second impurity region, and a third impurity region. The first main surface is provided with a gate electrode trench and a gate runner trench. The gate electrode trench is defined by a side surface and a bottom surface continuous to the side surface. The gate insulating film is in contact with both the side surface and the bottom surface. The first gate electrode is provided on the gate insulating film. The second gate electrode is provided in the gate runner trench, and is electrically connected to the first gate electrode. The gate runner is provided on the second gate electrode.

11 Claims, 4 Drawing Sheets

(58) Field of Classification Search
USPC .......................................................... 257/288
See application file for complete search history.

(56) References Cited

U.S. PATENT DOCUMENTS

2009/0166732 A1    7/2009  Hokomoto et al.
2014/0159107 A1    6/2014  Kurata et al.
2019/0333986 A1*  10/2019  Fukui ...................... H01L 29/36

FOREIGN PATENT DOCUMENTS

| JP | 2008-294157 | A | 12/2008 |
| JP | 2009-522807 | A | 6/2009 |
| JP | 2009-164183 | A | 7/2009 |
| WO | 2007/117312 | A2 | 10/2007 |
| WO | 2013/035818 | A1 | 3/2013 |
| WO | 2017/138215 | A1 | 8/2017 |

* cited by examiner

SILICON CARBIDE SEMICONDUCTOR DEVICE

TECHNICAL FIELD

The present disclosure relates to a silicon carbide semiconductor device. The present application claims a priority based on Japanese Patent Application No. 2017-240856 filed on Dec. 15, 2017, the entire content of which is incorporated herein by reference.

BACKGROUND ART

WO 2013/035818 (Patent Literature 1) describes a trench gate type IGBT (Insulated Gate Bipolar Transistor). In the IGBT, a gate runner electrically connected to a gate electrode for a trench gate is provided.

CITATION LIST

Patent Literature

PTL 1: WO 2013/035818

SUMMARY OF INVENTION

A silicon carbide semiconductor device according to the present disclosure includes a silicon carbide substrate, a gate insulating film, a first gate electrode, a first electrode, a second electrode, and a gate runner. The silicon carbide substrate has a first main surface and a second main surface opposite to the first main surface. The silicon carbide substrate includes: a first impurity region having a first conductivity type; a second impurity region provided on the first impurity region and having a second conductivity type different from the first conductivity type; and a third impurity region provided on the second impurity region to be separated from the first impurity region, the third impurity region having the first conductivity type. The first main surface is provided with a gate electrode trench and a gate runner trench. The gate electrode trench is defined by a side surface and a bottom surface continuous to the side surface. The side surface is constituted of the first impurity region, the second impurity region, and the third impurity region. The bottom surface is constituted of the first impurity region. The gate insulating film is in contact with both the side surface and the bottom surface. The first gate electrode is provided on the gate insulating film. The second gate electrode is provided in the gate runner trench and electrically connected to the first gate electrode. The first electrode is in contact with the third impurity region at the first main surface. The second electrode is in contact with the second main surface. The gate runner is provided on the second gate electrode.

A silicon carbide semiconductor device according to the present disclosure includes a silicon carbide substrate, a gate insulating film, a first gate electrode, a first electrode, a second electrode, and a gate runner. The silicon carbide substrate has a first main surface and a second main surface opposite to the first main surface. The silicon carbide substrate includes: a first impurity region having a first conductivity type; a second impurity region provided on the first impurity region and having a second conductivity type different from the first conductivity type; and a third impurity region provided on the second impurity region to be separated from the first impurity region, the third impurity region having the first conductivity type. The first main surface is provided with a gate electrode trench and a gate runner trench. The gate electrode trench is defined by a side surface and a bottom surface continuous to the side surface. The side surface is constituted of the first impurity region, the second impurity region, and the third impurity region. The bottom surface is constituted of the first impurity region. The gate insulating film is in contact with both the side surface and the bottom surface. The first gate electrode is provided on the gate insulating film. The second gate electrode is provided in the gate runner trench and electrically connected to the first gate electrode. The first electrode is in contact with the third impurity region at the first main surface. The second electrode is in contact with the second main surface. The gate runner is provided on the second gate electrode. The silicon carbide substrate includes a fourth impurity region located between the gate runner trench and the second main surface, the fourth impurity region having the second conductivity type, the fourth impurity region being in contact with the gate runner trench.

A silicon carbide semiconductor device according to the present disclosure includes a silicon carbide substrate, a gate insulating film, a first gate electrode, a first electrode, a second electrode, and a gate runner. The silicon carbide substrate has a first main surface and a second main surface opposite to the first main surface. The silicon carbide substrate includes: a first impurity region having a first conductivity type; a second impurity region provided on the first impurity region and having a second conductivity type different from the first conductivity type; a third impurity region provided on the second impurity region to be separated from the first impurity region, the third impurity region having the first conductivity type; and a fifth impurity region provided on the second impurity region, the fifth impurity region having the second conductivity type, the fifth impurity region having an impurity concentration higher than an impurity concentration of the second impurity region. The first main surface is provided with a gate electrode trench and a gate runner trench. The gate electrode trench is defined by a side surface and a bottom surface continuous to the side surface. The side surface is constituted of the first impurity region, the second impurity region, and the third impurity region. The bottom surface is constituted of the first impurity region. The gate insulating film is in contact with both the side surface and the bottom surface. The first gate electrode is provided on the gate insulating film. The second gate electrode is provided in the gate runner trench and electrically connected to the first gate electrode. The first electrode is in contact with the third impurity region at the first main surface. The second electrode is in contact with the second main surface. The gate runner is provided on the second gate electrode.

DETAILED DESCRIPTION

Figure 1:
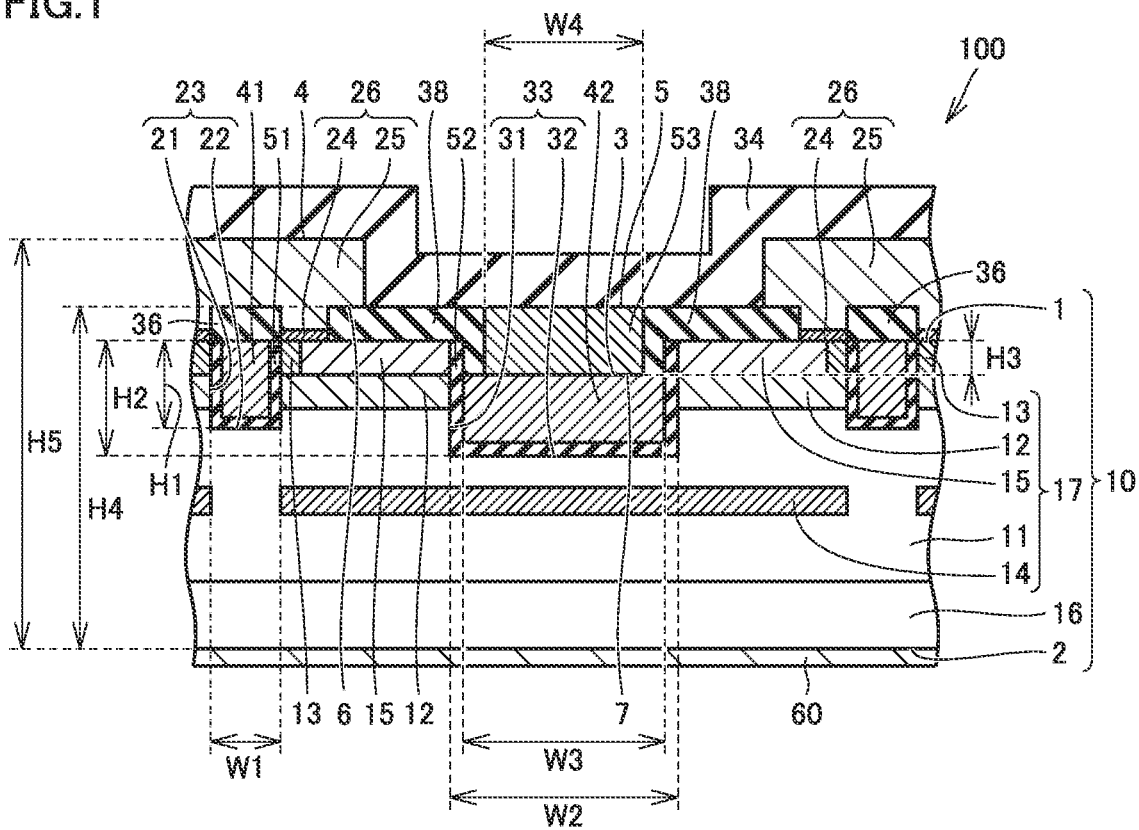
FIG. 1 is a schematic cross sectional view showing a configuration of a silicon carbide semiconductor device according to a first embodiment, and corresponds to a schematic cross sectional view taken along an I-I line of FIG. 2.

Summary of Embodiments of the Present Disclosure

First, the following describes a summary of embodiments of the present disclosure.

A gate runner mainly serves to transfer a gate signal to a gate electrode. Normally, the gate runner is disposed on a gate electrode provided on a silicon carbide substrate with a gate oxide film being interposed therebetween. On the other hand, a source pad is disposed on a surface of the silicon carbide substrate with no insulating layer being interposed therebetween. Hence, the location of the surface of the gate runner is higher than the location of the surface of the source pad by the gate oxide film and the gate electrode. For example, when bonding a wire to the source pad, the wire may be brought into contact with the gate runner that protrudes relative to the source pad. When the wire is brought into contact with the gate runner, an impact is applied to the gate runner, with the result that a crack may be generated in the gate runner.

(1) A silicon carbide semiconductor device 100 according to the present disclosure includes a silicon carbide substrate 10, a gate insulating film 51, a first gate electrode 41, a first electrode 26, a second electrode 60, and a gate runner 53. Silicon carbide substrate 10 has a first main surface 1 and a second main surface 2 opposite to first main surface 1. Silicon carbide substrate 10 includes: a first impurity region 11 having a first conductivity type; a second impurity region 12 provided on first impurity region 11 and having a second conductivity type different from the first conductivity type; and a third impurity region 13 provided on second impurity region 12 to be separated from first impurity region 11, third impurity region 13 having the first conductivity type. First main surface 1 is provided with a gate electrode trench 23 and a gate runner trench 33. Gate electrode trench 23 is defined by a side surface and a bottom surface continuous to the side surface. Side surface 21 is constituted of first impurity region 11, second impurity region 12, and third impurity region 13. Bottom surface 22 is constituted of first impurity region 11. Gate insulating film 51 is in contact with both side surface 21 and bottom surface 22. First gate electrode 41 is provided on gate insulating film 51. Second gate electrode 42 is provided in gate runner trench 33 and electrically connected to first gate electrode 41. First electrode 26 is in contact with third impurity region 13 at first main surface 1. Second electrode 60 is in contact with second main surface 2. Gate runner 53 is provided on second gate electrode 42.

In silicon carbide semiconductor device 100 according to (1), first main surface 1 is provided with gate electrode trench 23 and gate runner trench 33. Gate electrode trench 23 is defined by side surface 21 and bottom surface 22 continuous to side surface 21. Gate insulating film 51 is in contact with both side surface 21 and bottom surface 22. First gate electrode 41 is provided on gate insulating film 51. Second gate electrode 42 is provided in gate runner trench 33, and is electrically connected to first gate electrode 41. Gate runner 53 is provided on second gate electrode 42. Accordingly, the height of gate runner 53 can be lower than that in the case where gate runner trench 33 is not provided in first main surface 1. Therefore, when connecting, for example, an external interconnection such as a wire to the source pad, the external interconnection can be less likely to be brought into contact with gate runner 53 to apply an impact to gate runner 53. As a result, generation of crack can be suppressed in gate runner 53.

(2) According to silicon carbide semiconductor device 100 according to (1), in a direction perpendicular to second main surface 2, a boundary between second gate electrode 42 and gate runner 53 may be located between first main surface 1 and second main surface 2. Accordingly, the height of gate runner 53 can be further reduced. Hence, generation of crack can be further suppressed in gate runner 53.

(3) According to silicon carbide semiconductor device 100 according to (1) or (2), a depth of gate runner trench 33 may be larger than a depth of gate electrode trench 23.

(4) According to silicon carbide semiconductor device 100 according to any one of (1) to (3), silicon carbide substrate 10 may include a fourth impurity region 14 located between gate runner trench 33 and second main surface 2 and having the second conductivity type. Accordingly, an electric field can be suppressed from being concentrated on gate runner insulating film 52. Hence, breakage of gate runner insulating film 52 can be suppressed.

(5) According to silicon carbide semiconductor device 100 according to (4), fourth impurity region 14 may be in contact with gate runner trench 33. Accordingly, an electric field can be further suppressed from being concentrated on gate runner insulating film 52. Hence, breakage of gate runner insulating film 52 can be further suppressed.

(6) According to silicon carbide semiconductor device 100 according to any one of (1) to (5), third impurity region 13 may be separated from gate runner trench 33.

(7) According to silicon carbide semiconductor device 100 according to any one of (1) to (6), a width W2 of gate runner trench 33 at a cross section perpendicular to an extending direction of gate runner trench 33 may be larger than a width W1 of gate electrode trench 23 at a cross section perpendicular to an extending direction of gate electrode trench 23.

(8) According to silicon carbide semiconductor device 100 according to any one of (1) to (7), a width W3 of second gate electrode 42 at a cross section perpendicular to an extending direction of second gate electrode 42 may be larger than a width W4 of gate runner 53 at a cross section perpendicular to an extending direction of gate runner 53. When width W3 of second gate electrode 42 is the same as width W4 of gate runner 53, if a positioning error is large, gate runner 53 may be deviated to outside of gate runner trench 33 and may lie over first main surface 1. Since width W3 of second gate electrode 42 is made larger than width W4 of gate runner 53, gate runner 53 can be disposed inside gate runner trench 33 even when a positioning error is large to some extent, whereby gate runner 53 can be prevented from lying over first main surface 1. As a result, even when a positioning error is large to some extent, the height of gate runner 53 can be reduced.

(9) Silicon carbide semiconductor device 100 according to any one of (1) to (8) may further include a source pad 25 electrically connected to second impurity region 13. Gate runner 53 may include a third main surface 7 facing second main surface 2, and a fourth main surface 5 opposite to third main surface 7. Source pad 25 may include a fifth main surface 6 facing second main surface 2, and a sixth main surface 4 opposite to fifth main surface 6. In a direction perpendicular to second main surface 2, a distance H4 between fourth main surface 5 and second main surface 2 may be shorter than a distance H5 between sixth main surface 4 and second main surface 2. Accordingly, gate runner 53 can be made lower than source pad 25. Therefore, when connecting, for example, an external interconnection such as a wire to source pad 25, the external interconnection can be further less likely to be brought into contact with gate runner 53 to apply an impact to gate runner 53. As a result, generation of crack can be further suppressed in gate runner 53.

(10) According to silicon carbide semiconductor device 100 according to (1), in a direction perpendicular to second main surface 2, a boundary between second gate electrode 42 and gate runner 53 may be located between first main surface 1 and second main surface 2. Silicon carbide substrate 10 may include a fourth impurity region 14 located between gate runner trench 33 and second main surface 2 and having the second conductivity type. A width W3 of second gate electrode 42 at a cross section perpendicular to an extending direction of second gate electrode 42 may be larger than a width W4 of gate runner 53 at a cross section perpendicular to an extending direction of gate runner 53. Silicon carbide semiconductor device 100 may further include a source pad 25 electrically connected to second impurity region 13. Gate runner 53 may include a third main surface 7 facing second main surface 2, and a fourth main surface 5 opposite to third main surface 7. Source pad 25 may include a fifth main surface 6 facing second main surface 2, and a sixth main surface 4 opposite to fifth main surface 6. In the direction perpendicular to second main surface 2, a distance H4 between fourth main surface 5 and second main surface 2 may be shorter than a distance H5 between sixth main surface 4 and second main surface 2.

(11) A silicon carbide semiconductor device 100 according to the present disclosure includes a silicon carbide substrate 10, a gate insulating film 51, a first gate electrode 41, a first electrode 26, a second electrode 60, and a gate runner 53. Silicon carbide substrate 10 has a first main surface 1 and a second main surface 2 opposite to first main surface 1. Silicon carbide substrate 10 includes: a first impurity region 11 having a first conductivity type; a second impurity region 12 provided on first impurity region 11 and having a second conductivity type different from the first conductivity type; and a third impurity region 13 provided on second impurity region 12 to be separated from first impurity region 11, third impurity region 13 having the first conductivity type. First main surface 1 is provided with a gate electrode trench 23 and a gate runner trench 33. Gate electrode trench 23 is defined by a side surface and a bottom surface continuous to the side surface. Side surface 21 is constituted of first impurity region 11, second impurity region 12, and third impurity region 13. Bottom surface 22 is constituted of first impurity region 11. Gate insulating film 51 is in contact with both side surface 21 and bottom surface 22. First gate electrode 41 is provided on gate insulating film 51. Second gate electrode 42 is provided in gate runner trench 33 and electrically connected to first gate electrode 41. First electrode 26 is in contact with third impurity region 13 at first main surface 1. Second electrode 60 is in contact with second main surface 2. Gate runner 53 is provided on second gate electrode 42. Silicon carbide substrate 10 includes a fourth impurity region 14 located between gate runner trench 33 and second main surface 2, fourth impurity region 14 having the second conductivity type, fourth impurity region 14 being in contact with gate runner trench 33.

(12) A silicon carbide semiconductor device 100 according to the present disclosure includes a silicon carbide substrate 10, a gate insulating film 51, a first gate electrode 41, a first electrode 26, a second electrode 60, and a gate runner 53. Silicon carbide substrate 10 has a first main surface 1 and a second main surface 2 opposite to first main surface 1. Silicon carbide substrate 10 includes: a first impurity region 11 having a first conductivity type; a second impurity region 12 provided on first impurity region 11 and having a second conductivity type different from the first conductivity type; a third impurity region 13 provided on second impurity region 12 to be separated from first impurity region 11, third impurity region 13 having the first conductivity type; and a fifth impurity region 18 provided on second impurity region 12, fifth impurity region 18 having the second conductivity type, fifth impurity region 18 having an impurity concentration higher than an impurity concentration of second impurity region 12. First main surface 1 is provided with a gate electrode trench 23 and a gate runner trench 33. Gate electrode trench 23 is defined by a side surface and a bottom surface continuous to the side surface. Side surface 21 is constituted of first impurity region 11, second impurity region 12, and third impurity region 13. Bottom surface 22 is constituted of first impurity region 11. Gate insulating film 51 is in contact with both side surface 21 and bottom surface 22. First gate electrode 41 is provided on gate insulating film 51. Second gate electrode 42 is provided in gate runner trench 33 and electrically connected to first gate electrode 41. First electrode 26 is in contact with third impurity region 13 at first main surface 1. Second electrode 60 is in contact with second main surface 2. Gate runner 53 is provided on second gate electrode 42.

Details of Embodiments of the Present Disclosure

The following describes embodiments based on figures. It should be noted that in the below-described figures, the same or corresponding portions are given the same reference characters and are not described repeatedly. Regarding crystallographic indications in the present specification, an individual orientation is represented by [ ], a group orientation is represented by < >, and an individual plane is represented by ( ), and a group plane is represented by { }. In addition, a negative crystallographic index is normally expressed by putting "-" (bar) above a numeral, but is expressed by putting the negative sign before the numeral in the present specification.

First Embodiment

First, the following describes a configuration of a MOSFET (Metal Oxide Semiconductor Field Effect Transistor) serving as an exemplary silicon carbide semiconductor device 100 according to a first embodiment.

As shown in FIG. 1, MOSFET 100 according to the present embodiment mainly has a silicon carbide substrate 10, a gate insulating film 51, a first gate electrode 41, a source electrode 26 (first electrode 26), a drain electrode 60 (second electrode 60), a second gate electrode 42, a gate runner 53, a gate pad 80 (see FIG. 2), a first interlayer insulating film 36, a second interlayer insulating film 38, and a passivation layer 34. Silicon carbide substrate 10 includes a silicon carbide single crystal substrate 16, and a silicon carbide epitaxial layer 17 on silicon carbide single crystal substrate 16.

Silicon carbide substrate 10 has a first main surface 1, and a second main surface 2 opposite to first main surface 1. Silicon carbide epitaxial layer 17 forms first main surface 1. Silicon carbide single crystal substrate 16 forms second main surface 2. Each of silicon carbide single crystal substrate 16 and silicon carbide epitaxial layer 17 is composed of hexagonal silicon carbide having a polytype of 4H, for example. Silicon carbide single crystal substrate 16 includes an n type impurity such as nitrogen (N), and has an n type (first conductivity type), for example.

First main surface 1 corresponds to a {0001} plane or a plane inclined in an off direction by an off angle of less than or equal to 8° relative to the {0001} plane. Preferably, first main surface 1 corresponds to a (000-1) plane or a plane inclined in the off direction by an off angle of less than or equal to 8° relative to the (000-1) plane. The off direction may be a <11-20> direction or may be a <1-100> direction, for example. The off angle may be more than or equal to 1°, or may be more than or equal to 2°, for example. The off angle may be less than or equal to 6° or may be less than or equal to 4°.

Silicon carbide epitaxial layer 17 mainly has a drift region 11 (first impurity region 11), a body region 12 (second impurity region 12), a source region 13 (third impurity region 13), a fourth impurity region 14, and a contact region 15. Drift region 11 includes an n type impurity such as nitrogen and has the n type conductivity type, for example. The concentration of the n type impurity of drift region 11 may be lower than the concentration of the n type impurity of silicon carbide single crystal substrate 16. For example, the concentration of the n type impurity of drift region 11 is more than or equal to $1 \times 10^{14}$ cm$^{-3}$ and less than or equal to $5 \times 10^{16}$ cm$^{-3}$.

Body region 12 is provided on drift region 11. Body region 12 includes a p type impurity such as aluminum (Al) and has a p type (second conductivity type) conductivity type, for example. The concentration of the p type impurity in body region 12 is higher than the concentration of the n type impurity of drift region 11, for example. For example, the concentration of the p type impurity in body region 12 is more than or equal to $1 \times 10^{16}$ cm$^{-3}$ and less than or equal to $5 \times 10^{18}$ cm$^{-3}$.

Source region 13 is provided on body region 12 to be separated from drift region 11 by body region 12. Source region 13 includes an n type impurity such as nitrogen or phosphorus (P) and has the n type conductivity type, for example. Source region 13 forms a portion of first main surface 1. The concentration of the n type impurity of source region 13 is higher than the concentration of the p type impurity of body region 12, for example. For example, the concentration of the n type impurity of source region 13 is about $1 \times 10^{19}$ cm$^{-3}$.

Contact region 15 includes a p type impurity such as aluminum and has the p type conductivity type, for example. The concentration of the p type impurity of contact region 15 is higher than the concentration of the p type impurity of body region 12, for example. Contact region 15 extends through source region 13, and is in contact with body region 12. Contact region 15 forms a portion of first main surface 1. For example, the concentration of the p type impurity of contact region 15 is more than or equal to $1 \times 10^{18}$ cm$^{-3}$ and less than or equal to $1 \times 10^{20}$ cm$^{-3}$.

A gate electrode trench 23 is provided in first main surface 1. Gate electrode trench 23 is defined by a first side surface 21 and a first bottom surface 22. First side surface 21 extends through source region 13 and body region 12 and reaches drift region 11. First bottom surface 22 is continuous to first side surface 21. First bottom surface 22 is located in drift region 11. First side surface 21 is constituted of drift region 11, body region 12, and source region 13. First bottom surface 22 is constituted of drift region 11.

First bottom surface 22 is a flat surface parallel to second main surface 2, for example. First side surface 21 extends in a direction substantially perpendicular to first bottom surface 22, for example. First side surface 21 may be inclined relative to first bottom surface 22 such that the width of gate electrode trench 23 becomes wider from first bottom surface 22 toward first main surface 1. Gate electrode trench 23 extends in the form of stripes along a direction parallel to second main surface 2, for example. Gate electrode trench 23 may extend in the form of a honeycomb, or may exist in the form of islands.

A gate insulating film 51 is, for example, an oxide film. Gate insulating film 51 is composed of a material including silicon dioxide, for example. Gate insulating film 51 is in contact with both first side surface 21 and first bottom surface 22. Gate insulating film 51 is in contact with drift region 11 at first bottom surface 22. Gate insulating film 51 is in contact with each of source region 13, body region 12, and drift region 11 at first side surface 21.

A first gate electrode 41 is provided on gate insulating film 51. First gate electrode 41 is composed of polysilicon including a conductive impurity, for example. First gate electrode 41 is disposed inside gate electrode trench 23, for example. Gate insulating film 51 is provided between first gate electrode 41 and each of source region 13, body region 12, and drift region 11.

A gate runner trench 33 is provided in first main surface 1. Gate runner trench 33 is defined by a second side surface 31 and a second bottom surface 32. Second side surface 31 extends through contact region 15 and body region 12 and reaches drift region 11. Second bottom surface 32 is continuous to second side surface 31. Second bottom surface 32 is located in drift region 11. Second side surface 31 is constituted of drift region 11, body region 12, and contact region 15. Second bottom surface 32 is constituted of drift region 11. Second bottom surface 32 is a flat surface parallel to second main surface 2, for example. Second side surface 31 extends in a direction substantially perpendicular to second bottom surface 32, for example. Second side surface 31 may be inclined relative to second bottom surface 32 such that the width of gate runner trench 33 becomes wider from second bottom surface 32 toward first main surface 1. Gate runner trench 33 extends in the form of stripes along the direction parallel to second main surface 2, for example.

A gate runner insulating film 52 is, for example, an oxide film. Gate runner insulating film 52 is composed of a material including silicon dioxide, for example. Gate runner insulating film 52 is in contact with both second side surface 31 and second bottom surface 32. Gate runner insulating film 52 is in contact with drift region 11 at second bottom surface 32. Gate runner insulating film 52 is in contact with each of contact region 15, body region 12, and drift region 11 at second side surface 31. From a different viewpoint, it can be said that source region 13 is separated from gate runner trench 33.

A second gate electrode 42 is provided on gate runner insulating film 52. Second gate electrode 42 is composed of polysilicon including a conductive impurity, for example. Second gate electrode 42 is provided in gate runner trench 33. The material of second gate electrode 42 is the same as the material of first gate electrode 41, for example. Second gate electrode 42 is electrically connected to first gate electrode 41. Second gate electrode 42 and first gate electrode 41 may be formed as one member, or may be formed as separate members. Second gate electrode 42 may be directly continuous to first gate electrode 41, or may be electrically connected to first gate electrode 41 via another conductor.

A gate runner 53 is provided on second gate electrode 42. The material of gate runner 53 is different from the material of each of first gate electrode 41 and second gate electrode 42. The electric conductivity of the material of gate runner 53 may be higher than the electric conductivity of the material of each of first gate electrode 41 and second gate electrode 42. Gate runner 53 is composed of a material including aluminum, for example.

A portion of gate runner 53 may be disposed in gate runner trench 33. Gate runner 53 is provided to face second bottom surface 32, for example. A portion of gate runner 53 may face second side surface 31. A depth H3 in which gate runner 53 is in gate runner trench 33 is more than or equal to 0.1 μm and less than or equal to 2 μm, for example. Depth H3 represents a distance between first main surface 1 and a boundary in the direction perpendicular to second main surface 2.

In the direction perpendicular to second main surface 2, boundary 3 between second gate electrode 42 and gate runner 53 may be located between first main surface 1 and second main surface 2. Specifically, in the direction perpendicular to second main surface 2, boundary 3 is located between first main surface 1 and second bottom surface 32. Boundary 3 is located at the second bottom surface 32 side relative to first main surface 1. Gate runner 53 has a fourth main surface 5 located opposite to boundary 3.

Depth H2 of gate runner trench 33 may be larger than depth H1 of gate electrode trench 23. Depth H1 of gate electrode trench 23 is more than or equal to 0.5 μm and less than or equal to 2.5 μm, for example. Depth H2 of gate runner trench 33 is more than or equal to 0.5 μm and less than or equal to 3.0 μm, for example.

Width W2 of gate runner trench 33 at the cross section perpendicular to the extending direction of gate runner trench 33 may be larger than width W1 of gate electrode trench 23 at the cross section perpendicular to the extending direction of gate electrode trench 23. Width W1 of gate electrode trench 23 is more than or equal to 0.25 μm and less than or equal to 3.0 μm, for example. Width W2 of gate runner trench 33 is more than or equal to 0.30 μm and less than or equal to 1000 μm, for example. It should be noted that the extending direction of the trench refers to a direction parallel to the bottom surface of the trench and parallel to the side surface of the trench.

Width W3 of second gate electrode 42 at the cross section perpendicular to the extending direction of second gate electrode 42 may be larger than width W4 of gate runner 53 at the cross section perpendicular to the extending direction of gate runner 53. Width W3 of second gate electrode 42 is more than or equal to 0.30 μm and less than or equal to 1000 μm, for example. Width W4 of gate runner 53 is more than or equal to 0.4 μm and less than or equal to 995 for example. It should be noted that the extending direction of second gate electrode 42 refers to a long side direction of second gate electrode 42. The same applies to the extending direction of gate runner 53.

Fourth impurity region 14 is located between gate runner trench 33 and second main surface 2, for example. Specifically, fourth impurity region 14 is located between second bottom surface 32 and second main surface 2. Fourth impurity region 14 includes a p type impurity such as aluminum (Al) and has the p type (second conductivity type) conductivity type, for example. For example, the concentration of the p type impurity of fourth impurity region 14 is more than or equal to $1\times10^{16}$ cm$^{-3}$ and less than or equal to $1\times10^{19}$ cm$^{-3}$. At the cross section perpendicular to the extending direction of gate runner trench 33, the width of fourth impurity region 14 may be larger than width W2 of second bottom surface 32.

Fourth impurity region 14 may not be disposed just below gate electrode trench 23. Specifically, fourth impurity region 14 is not disposed at a region between first bottom surface 22 and second main surface 2. At the region between first bottom surface 22 and second main surface 2, drift region 11 is disposed, for example. Drift region 11 is sandwiched by fourth impurity region 14, for example. Fourth impurity region 14 may be electrically connected to source electrode 26, or may be floating.

For example, at first main surface 1, source electrode 26 is in contact with source region 13 and contact region 15. Source electrode 26 has a contact electrode 24 and a source pad 25. Source electrode 26 is provided in a source trench (not shown) provided in first main surface 1, and may be in contact with source region 13 at the wall surface of the source trench. Source pad 25 is located on contact electrode 24. Source pad 25 is electrically connected to source region 13. Contact electrode 24 may be in contact with source region 13 and contact region 15 at first main surface 1. Contact electrode 24 is composed of a material including Ti, Al, and Si, for example. Contact electrode 24 makes ohmic junction with source region 13. Contact electrode 24 may make ohmic junction with contact region 15.

As shown in FIG. 1, gate runner 53 includes a third main surface 7 facing second main surface 2, and a fourth main surface 5 opposite to third main surface 7. Source pad 25 includes a fifth main surface 6 facing second main surface 2, and a sixth main surface 4 opposite to fifth main surface 6. In the direction perpendicular to second main surface 2, distance H4 between fourth main surface 5 and second main surface 2 may be shorter than distance H5 between sixth main surface 4 and second main surface 2. From a different viewpoint, it can be said that gate runner 53 may be lower than source pad 25.

Drain electrode 60 is in contact with second main surface 2. Drain electrode 60 is in contact with silicon carbide single crystal substrate 16 at second main surface 2. Drain electrode 60 is electrically connected to drift region 11. Drain electrode 60 is composed of a material including NiSi or TiAlSi, for example.

A first interlayer insulating film 36 is provided on each of first gate electrode 41 and gate insulating film 51, for example. For example, first interlayer insulating film 36 is in contact with each of first gate electrode 41 and gate insulating film 51. First interlayer insulating film 36 is composed of a material including silicon dioxide, for example. First interlayer insulating film 36 electrically insulates between first gate electrode 41 and source electrode 26, for example. First interlayer insulating film 36 is covered with source electrode 26, for example. The upper surface of first interlayer insulating film 36 is in contact with source pad 25, for example. The side surface of first interlayer insulating film 36 is in contact with each of source pad 25 and contact electrode 24, for example.

A second interlayer insulating film 38 is provided on contact region 15, for example. Second interlayer insulating film 38 is in contact with contact region 15 at first main surface 1, for example. Second interlayer insulating film 38 is composed of a material including silicon dioxide, for example. Second interlayer insulating film 38 electrically insulates between gate runner 53 and source electrode 26, for example. A portion of second interlayer insulating film 38 may be located in a portion of gate runner trench 33, and may be in contact with the upper surface of second gate electrode 42. Second interlayer insulating film 38 is in contact with gate runner 53 and gate runner insulating film 52, for example. A portion of second interlayer insulating film 38 may be disposed between gate runner 53 and gate runner insulating film 52, for example.

Passivation layer 34 is provided to cover source electrode 26, gate runner 53, and second interlayer insulating film 38. Passivation layer 34 is in contact with each of source electrode 26, gate runner 53, and second interlayer insulating film 38. Passivation layer 34 is composed of a material such as silicon nitride (SiN), silicon dioxide, or polyimide, for example.

Figure 2:
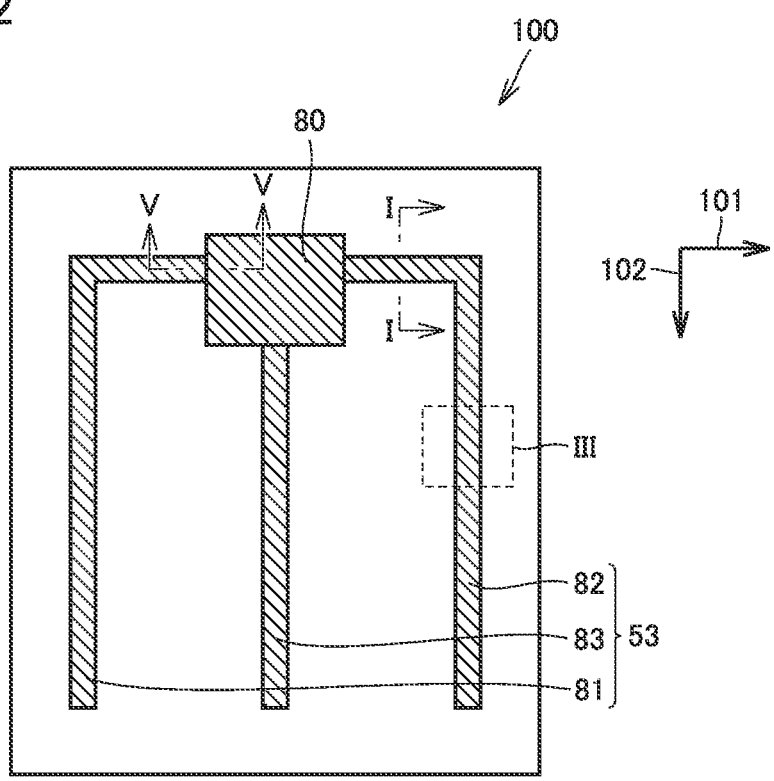
FIG. 2 is a schematic plan view showing the configuration of the silicon carbide semiconductor device according to the first embodiment.

As shown in FIG. 2, when seen in the direction perpendicular to second main surface 2, a gate pad 80 has a rectangular shape, for example. Gate runner 53 has a first gate runner portion 81, a second gate runner portion 82, and a third gate runner portion 83, for example. As shown in FIG. 2, each of first gate runner portion 81 and second gate runner portion 82 has an L shape, for example. First gate runner portion 81 extends from one end of gate pad 80 in a direction that is parallel to a first direction 101 and that is further away from gate pad 80. First gate runner portion 81 is bent at a certain portion by about 90° and extends in a direction parallel to a second direction 102. First direction 101 is a <11-20> direction, for example. Second direction 102 is a direction that is perpendicular to first direction 101 and that is parallel to second main surface 2, for example. Second direction 102 is a <1-100> direction, for example.

Second gate runner portion 82 extends from the other end of gate pad 80 in the direction that is parallel to first direction 101 and that is further away from gate pad 80. Second gate runner portion R2 is bent at a certain portion by about 90° and extends in the direction parallel to second direction 102. When seen in the direction perpendicular to second main surface 2, third gate runner portion 83 has an elongated rectangular shape. Third gate runner portion 83 is located between first gate runner portion 81 and second gate runner portion 82. Third gate runner portion 83 extends in the direction parallel to second direction 102, for example.

Figure 3:
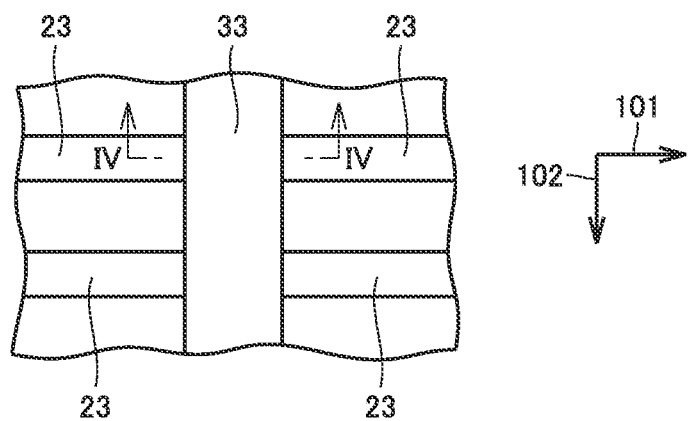
FIG. 3 is a schematic plan view showing configurations of a gate electrode trench and a gate runner trench in a region III of FIG. 2.

FIG. 3 is a schematic plan view showing configurations of the gate electrode trench and the gate runner trench at a region III of FIG. 2. As shown in FIG. 3, gate runner trench 33 extends in the direction parallel to second direction 102, for example. Gate electrode trench 23 extends in the direction parallel to first direction 101, for example. Gate electrode trench 23 may be located to face both sides of gate runner trench 33. Gate electrode trench 23 is continuous to gate runner trench 33.

Figure 4:
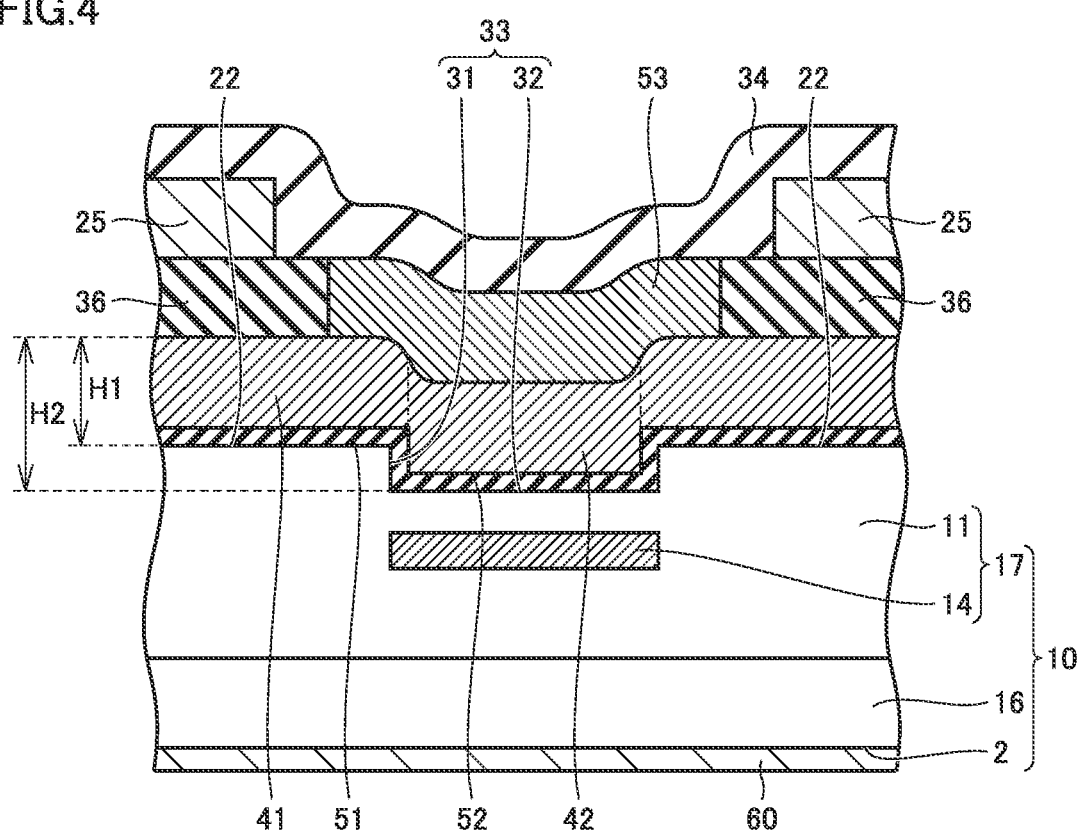
FIG. 4 is a schematic cross sectional view taken along a IV-IV line of FIG. 3.

As shown in FIG. 4, first bottom surface 22 of gate electrode trench 23 may be continuous to second side surface 31 of gate runner trench 33. Gate insulating film 51 is continuous to gate runner insulating film 52. First gate electrode 41 may be continuous to second gate electrode 42 at the boundary between first bottom surface 22 and second side surface 31. Gate runner 53 is disposed on second gate electrode 42. A portion of gate runner 53 is in contact with first gate electrode 41, for example. A portion of gate runner 53 may lie over first gate electrode 41.

As shown in FIG. 4, a portion of gate runner 53 may be disposed to face first bottom surface 22. Gate runner 53 may be disposed on the boundary between first bottom surface 22 and second side surface 31. Gate runner 53 may be in contact with first interlayer insulating film 36. A portion of gate runner 53 may be interposed between first gate electrode 41 and passivation layer 34.

Figure 5:
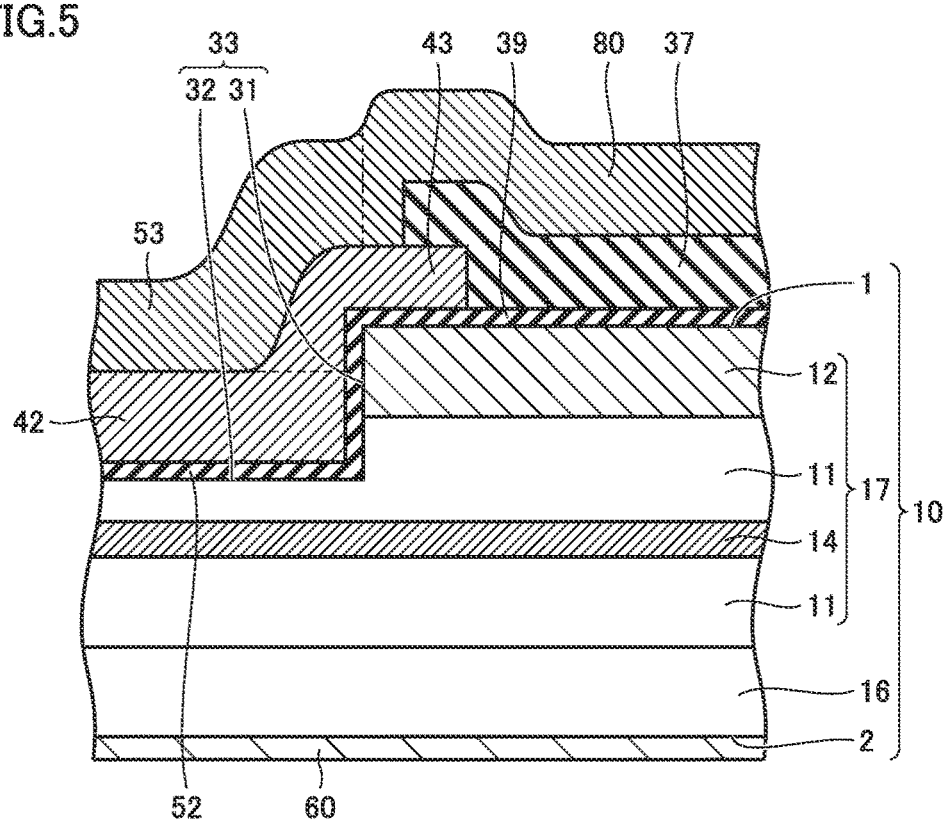
FIG. 5 is a schematic cross sectional view taken along a V-V line of FIG. 2.

As shown in FIG. 5, MOSFET 100 according to the present embodiment may further have a first insulating layer 39, a second insulating layer 37, and a connection gate electrode 43. First insulating layer 39 is provided on first main surface 1. First insulating layer 39 may be in contact with body region 12 at first main surface 1, for example. First insulating layer 39 is in contact with gate runner insulating film 52, for example. Second insulating layer 37 is provided on first insulating layer 39. Second insulating layer 37 may be provided to face body region 12. Connection gate electrode 43 is continuous to second gate electrode 42, for example. A portion of connection gate electrode 43 lies over first insulating layer 39, for example. Connection gate electrode 43 is composed of the same material as that of second gate electrode 42, for example.

A portion of second insulating layer 37 may lie over connection gate electrode 43, for example. A portion of connection gate electrode 43 may be interposed between first insulating layer 39 and second insulating layer 37, for example. A portion of gate runner 53 may lie over connection gate electrode 43. Gate runner 53 may be continuous to gate pad 80 on connection gate electrode 43. Gate pad 80 is provided on second insulating layer 37. Gate pad 80 may be in contact with connection gate electrode 43. Gate pad 80 may be provided to face body region 12. Gate pad 80 may be provided to face fourth impurity region 14.

Next, the following describes function and effect of MOSFET 100 according to the first embodiment.

In MOSFET 100 according to the first embodiment, first main surface 1 is provided with gate electrode trench 23 and gate runner trench 33. Gate electrode trench 23 is defined by side surface 21 and bottom surface 22 continuous to side surface 21. Gate insulating film 51 is in contact with both side surface 21 and bottom surface 22. First gate electrode 41 is provided on gate insulating film 51. Second gate electrode 42 is provided in gate runner trench 33, and is electrically connected to first gate electrode 41. Gate runner 53 is provided on second gate electrode 42. Accordingly, the height of gate runner 53 can be lower than that in the case where gate runner trench 33 is not provided in first main surface 1. Therefore, when connecting, for example, an external interconnection such as a wire to source pad 25, the external interconnection can be less likely to be brought into contact with gate runner 53 to apply an impact to gate runner 53. As a result, generation of crack can be suppressed in gate runner 53.

Moreover, according to MOSFET 100 according to the first embodiment, in the direction perpendicular to second main surface 2, the boundary between second gate electrode 42 and gate runner 53 may be located between first main surface 1 and second main surface 2. Accordingly, the height of gate runner 53 can be further reduced. Hence, generation of crack can be further suppressed in gate runner 53.

Further, according to MOSFET 100 according to the first embodiment, silicon carbide substrate 10 may include fourth impurity region 14 located between gate runner trench 33 and second main surface 2 and having the second conductivity type. Accordingly, an electric field can be suppressed from being concentrated on gate runner insulating film 52. Hence, breakage of gate runner insulating film 52 can be suppressed.

Further, according to MOSFET 100 according to the first embodiment, the width of second gate electrode 42 at the cross section perpendicular to the extending direction of second gate electrode 42 may be larger than the width of gate runner 53 at the cross section perpendicular to the extending direction of gate runner 53. When the width of second gate electrode 42 is the same as the width of gate runner 53, if a positioning error is large, gate runner 53 may be deviated to outside of gate runner trench 33 and may lie over first main surface 1. Since the width of second gate electrode 42 is made larger than the width of gate runner 53, gate runner 53 can be disposed inside gate runner trench 33 even when a positioning error is large to some extent, whereby gate runner 53 can be prevented from lying over first main surface 1. As a result, even when a positioning error is large to some extent, the height of gate runner 53 can be reduced.

Further, MOSFET 100 according to the first embodiment further has source pad 25 electrically connected to second impurity region 13. Gate runner 53 includes third main surface 7 facing second main surface 2, and fourth main surface 5 opposite to third main surface 7. Source pad 25 includes fifth main surface 6 facing second main surface 2, and sixth main surface 4 opposite to fifth main surface 6. In the direction perpendicular to second main surface 2, the distance between fourth main surface 5 and second main surface 2 is shorter than the distance between sixth main surface 4 and second main surface 2. Accordingly, gate runner 53 can be made lower than source pad 25. Therefore, when connecting, for example, an external interconnection such as a wire to source pad 25, the external interconnection can be further less likely to be brought into contact with gate runner 53 to apply an impact to gate runner 53. As a result, generation of crack can be further suppressed in gate runner 53.

Second Embodiment

Next, the following describes a configuration of a MOSFET 100 according to a second embodiment. MOSFET 100 according to the second embodiment is different from MOSFET 100 according to the first embodiment in the following configuration: fourth impurity region 14 is in contact with gate runner trench 33. The other configurations thereof are substantially the same as those of MOSFET 100 according to the first embodiment. In the description below, the configuration different from that of MOSFET 100 according to the first embodiment will be mainly described.

Figure 6:
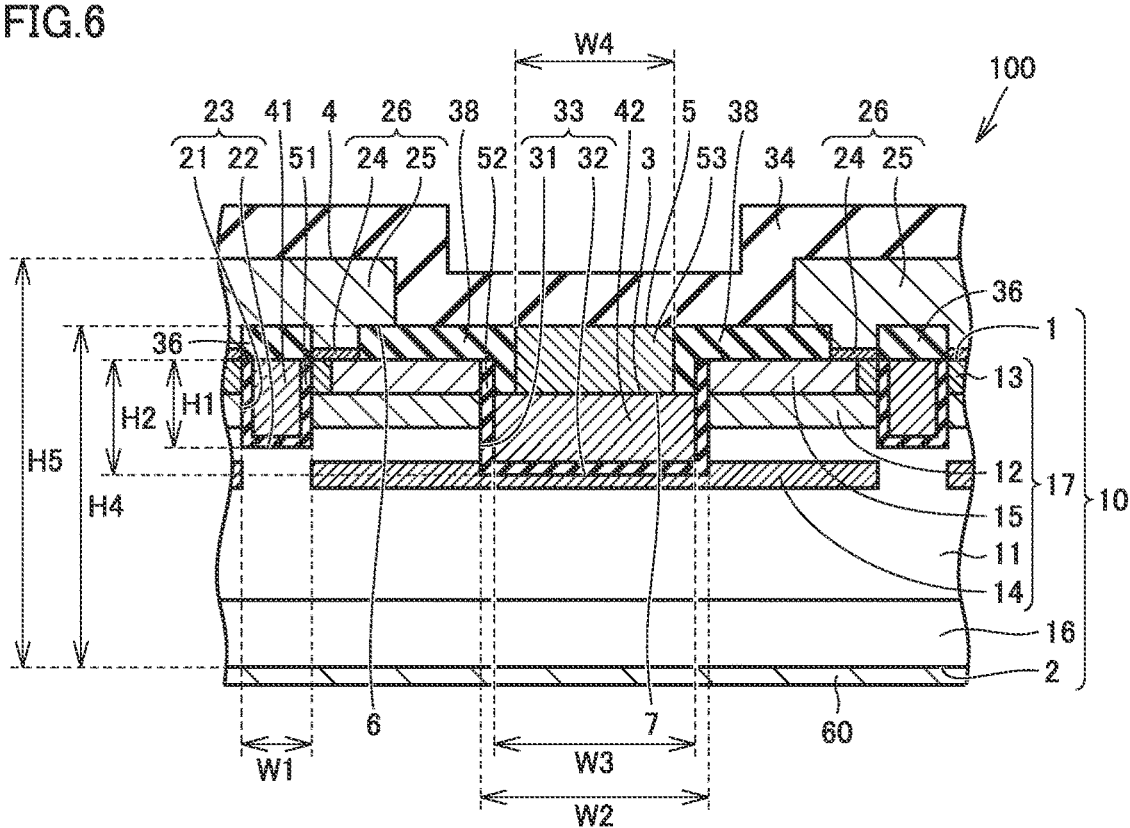
FIG. 6 is a schematic cross sectional view showing a configuration of a silicon carbide semiconductor device according to a second embodiment.

As shown in FIG. 6, fourth impurity region 14 may be in contact with gate runner trench 33. Specifically, a portion of gate runner trench 33 is embedded in fourth impurity region 14. Second bottom surface 32 of gate runner trench 33 is in contact with fourth impurity region 14. A portion of second side surface 31 of gate runner trench 33 is in contact with fourth impurity region 14. From a different viewpoint, it can be said that gate runner insulating film 52 is in contact with fourth impurity region 14 at second bottom surface 32. Gate runner insulating film 52 is in contact with fourth impurity region 14 at a portion of second side surface 31. Second bottom surface 32 is constituted of fourth impurity region 14. Second side surface 31 is constituted of fourth impurity region 14, drift region 11, body region 12, and contact region 15.

According to MOSFET 100 according to the second embodiment, fourth impurity region 14 is in contact with gate runner trench 33. Accordingly, an electric field can be further suppressed from being concentrated on gate runner insulating film 52. Hence, breakage of gate runner insulating film 52 can be further suppressed.

Third Embodiment

Next, the following describes a configuration of a MOSFET 100 according to a third embodiment. MOSFET 100 according to the third embodiment is different from MOSFET 100 according to the first embodiment in the following configuration: a fifth impurity region 18 is provided on body region 12. The other configurations thereof are substantially the same as those of MOSFET 100 according to the first embodiment. In the description below, the configuration different from that of MOSFET 100 according to the first embodiment will be mainly described.

Figure 7:
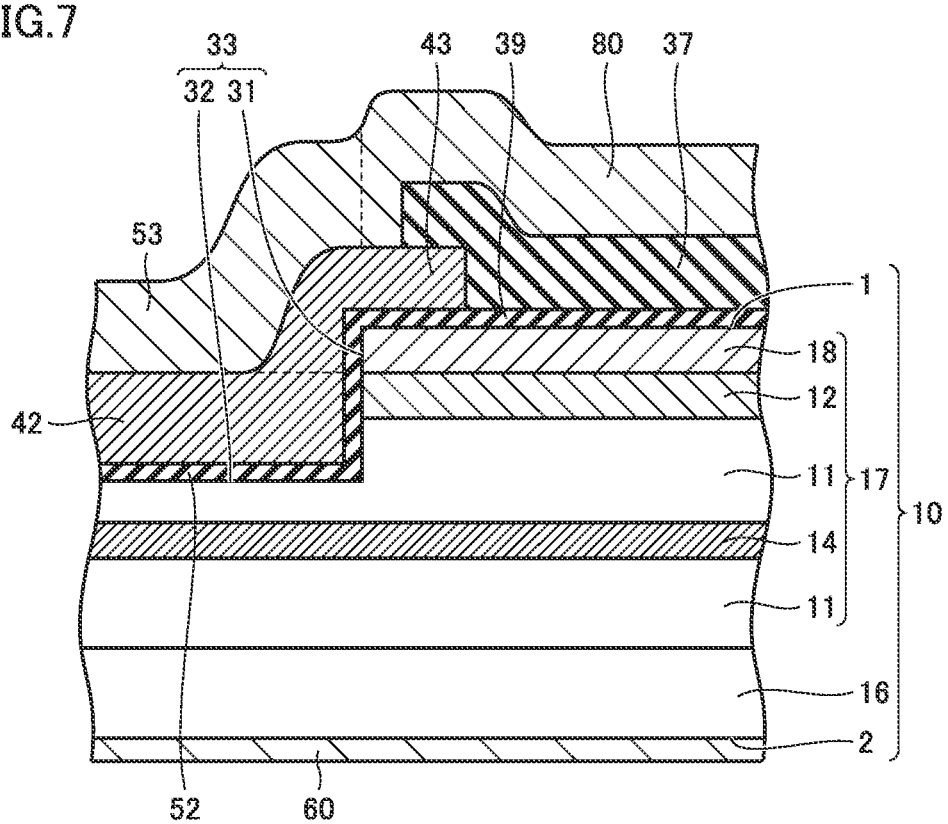
FIG. 7 is a schematic cross sectional view showing a configuration of a silicon carbide semiconductor device according to a third embodiment.

As shown in FIG. 7, silicon carbide substrate 10 may further have fifth impurity region 18. Fifth impurity region 18 includes a p type impurity such as aluminum and has the p type conductivity type, for example. The concentration of the p type impurity of fifth impurity region 18 is higher than the concentration of the p type impurity of body region 12, for example. Fifth impurity region 18 forms a portion of first main surface 1. The concentration of the p type impurity of fifth impurity region 18 may be the same as the concentration of the p type impurity of contact region 15. Fifth impurity region 18 is located between body region 12 and first insulating layer 39, for example.

Fifth impurity region 18 is in contact with second side surface 31 of gate runner trench 33, for example. From a different viewpoint, it can be said that a portion of second side surface 31 may be constituted of fifth impurity region 18. Fifth impurity region 18 may be disposed to face gate pad 80. In the direction perpendicular to first main surface 1, first insulating layer 39 may be located between fifth impurity region 18 and connection gate electrode 43. In the direction perpendicular to second side surface 31, gate runner insulating film 52 may be located between fifth impurity region 18 and connection gate electrode 43.

According to MOSFET 100 according to the third embodiment, fifth impurity region 18 is located between body region 12 and first insulating layer 39. Accordingly, an electric field can be suppressed from being concentrated on first insulating layer 39. Hence, breakage of first insulating layer 39 can be suppressed.

It should be noted that in each of the above-described embodiments, it has been described that the n type corresponds to the first conductivity type and the p type corresponds to the second conductivity type; however, the p type may correspond to the first conductivity type and the n type may correspond to the second conductivity type. Moreover, in each of the above-described embodiments, MOSFET 100 has been illustratively described as the silicon carbide semiconductor device; however, the silicon carbide semiconductor device may be an IGBT or the like, for example. The concentrations of the p type and n type impurities in the impurity regions can be measured by an SCM (Scanning Capacitance Microscope), a SIMS (Secondary Ion Mass Spectrometry), or the like, for example. Moreover, the location of a boundary surface (i.e., a PN interface) between a p type region and an n type region can be specified by the SCM, SIMS, or the like, for example.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: first main surface; 2: second main surface; 3: boundary; 4: sixth main surface; 5: fourth main surface; 6: fifth main surface; 7: third main surface; 10: silicon carbide substrate; 11: drift region (first impurity region); 12:

body region (second impurity region); 13: source region (third impurity region); 14: fourth impurity region; 15: contact region; 16: silicon carbide single crystal substrate; 17: silicon carbide epitaxial layer; 18: fifth impurity region; 21: side surface (first side surface); 22: bottom surface (first bottom surface); 23: gate electrode trench; 24: contact electrode; 25: source pad; 26: first electrode (source electrode); 31: second side surface; 32: second bottom surface; 33: gate runner trench; 34: passivation layer; 36: first interlayer insulating film; 37: second insulating layer; 38: second interlayer insulating film; 39: first insulating layer; 41: first gate electrode; 42: second gate electrode; 43: connection gate electrode; 51: gate insulating film; 52: gate runner insulating film; 53: gate runner; 60: second electrode (drain electrode); 80: gate pad; 81: first gate runner portion; 82: second gate runner portion; 83: third gate runner portion; 100: MOSFET (silicon carbide semiconductor device); 101: first direction; 102: second direction.

The invention claimed is:

1. A silicon carbide semiconductor device comprising a silicon carbide substrate having a first main surface and a second main surface opposite to the first main surface, wherein
the silicon carbide substrate includes
a first impurity region having a first conductivity type,
a second impurity region provided on the first impurity region and having a second conductivity type different from the first conductivity type, and
a third impurity region provided on the second impurity region to be separated from the first impurity region, the third impurity region having the first conductivity type,
the first main surface is provided with a gate electrode trench and a gate runner trench,
the gate electrode trench is defined by a side surface and a bottom surface continuous to the side surface,
the side surface is constituted of the first impurity region, the second impurity region, and the third impurity region, and
the bottom surface is constituted of the first impurity region,
the silicon carbide semiconductor device further comprising:
a gate insulating film in contact with both the side surface and the bottom surface;
a first gate electrode provided on the gate insulating film;
a second gate electrode provided in the gate runner trench and electrically connected to the first gate electrode;
a first electrode in contact with the third impurity region at the first main surface;
a second electrode in contact with the second main surface; and
a gate runner provided on the second gate electrode,
wherein a depth of the gate runner trench is larger than a depth of the gate electrode trench.

2. The silicon carbide semiconductor device according to claim 1, wherein in a direction perpendicular to the second main surface, a boundary between the second gate electrode and the gate runner is located between the first main surface and the second main surface.

3. The silicon carbide semiconductor device according to claim 1, wherein the third impurity region is separated from the gate runner trench.

4. The silicon carbide semiconductor device according to claim 1, wherein a width of the gate runner trench at a cross section perpendicular to an extending direction of the gate runner trench is larger than a width of the gate electrode trench at a cross section perpendicular to an extending direction of the gate electrode trench.

5. The silicon carbide semiconductor device according to claim 1, wherein a width of the second gate electrode at a cross section perpendicular to an extending direction of the second gate electrode is larger than a width of the gate runner at a cross section perpendicular to an extending direction of the gate runner.

6. A silicon carbide semiconductor device comprising a silicon carbide substrate having a first main surface and a second main surface opposite to the first main surface, wherein
the silicon carbide substrate includes
a first impurity region having a first conductivity type,
a second impurity region provided on the first impurity region and having a second conductivity type different from the first conductivity type, and
a third impurity region provided on the second impurity region to be separated from the first impurity region, the third impurity region having the first conductivity type,
the first main surface is provided with a gate electrode trench and a gate runner trench,
the gate electrode trench is defined by a side surface and a bottom surface continuous to the side surface,
the side surface is constituted of the first impurity region, the second impurity region, and the third impurity region, and
the bottom surface is constituted of the first impurity region,
the silicon carbide semiconductor device further comprising:
a gate insulating film in contact with both the side surface and the bottom surface;
a first gate electrode provided on the gate insulating film;
a second gate electrode provided in the gate runner trench and electrically connected to the first gate electrode;
a first electrode in contact with the third impurity region at the first main surface;
a second electrode in contact with the second main surface; and
a gate runner provided on the second gate electrode,
wherein the silicon carbide substrate includes a fourth impurity region located between the gate runner trench and the second main surface and having the second conductivity type.

7. The silicon carbide semiconductor device according to claim 6, wherein the fourth impurity region is in contact with the gate runner trench.

8. A silicon carbide semiconductor device comprising a silicon carbide substrate having a first main surface and a second main surface opposite to the first main surface, wherein
the silicon carbide substrate includes
a first impurity region having a first conductivity type,
a second impurity region provided on the first impurity region and having a second conductivity type different from the first conductivity type, and
a third impurity region provided on the second impurity region to be separated from the first impurity region, the third impurity region having the first conductivity type,
the first main surface is provided with a gate electrode trench and a gate runner trench, the gate electrode trench is defined by a side surface and a bottom surface continuous to the side surface,
the side surface is constituted of the first impurity region, the second impurity region, and the third impurity region, and
the bottom surface is constituted of the first impurity region,
the silicon carbide semiconductor device further comprising:
a gate insulating film in contact with both the side surface and the bottom surface;
a first gate electrode provided on the gate insulating film;
a second gate electrode provided in the gate runner trench and electrically connected to the first gate electrode;
a first electrode in contact with the third impurity region at the first main surface;
a second electrode in contact with the second main surface;
a gate runner provided on the second gate electrode; and
a source pad electrically connected to the second impurity region, wherein
the gate runner includes a third main surface facing the second main surface, and a fourth main surface opposite to the third main surface,
the source pad includes a fifth main surface facing the second main surface, and a sixth main surface opposite to the fifth main surface, and
in a direction perpendicular to the second main surface, a distance between the fourth main surface and the second main surface is shorter than a distance between the sixth main surface and the second main surface.

9. A silicon carbide semiconductor device comprising a silicon carbide substrate having a first main surface and a second main surface opposite to the first main surface, wherein
the silicon carbide substrate includes
a first impurity region having a first conductivity type,
a second impurity region provided on the first impurity region and having a second conductivity type different from the first conductivity type, and
a third impurity region provided on the second impurity region to be separated from the first impurity region, the third impurity region having the first conductivity type,
the first main surface is provided with a gate electrode trench and a gate runner trench,
the gate electrode trench is defined by a side surface and a bottom surface continuous to the side surface,
the side surface is constituted of the first impurity region, the second impurity region, and the third impurity region, and
the bottom surface is constituted of the first impurity region,
the silicon carbide semiconductor device further comprising:
a gate insulating film in contact with both the side surface and the bottom surface;
a first gate electrode provided on the gate insulating film;
a second gate electrode provided in the gate runner trench and electrically connected to the first gate electrode;
a first electrode in contact with the third impurity region at the first main surface;
a second electrode in contact with the second main surface; and
a gate runner provided on the second gate electrode, wherein in a direction perpendicular to the second main surface, a boundary between the second gate electrode and the gate runner is located between the first main surface and the second main surface,
the silicon carbide substrate includes a fourth impurity region located between the gate runner trench and the second main surface and having the second conductivity type,
a width of the second gate electrode at a cross section perpendicular to an extending direction of the second gate electrode is larger than a width of the gate runner at a cross section perpendicular to an extending direction of the gate runner,
the silicon carbide semiconductor device further comprising a source pad electrically connected to the second impurity region, wherein
the gate runner includes a third main surface facing the second main surface, and a fourth main surface opposite to the third main surface,
the source pad includes a fifth main surface facing the second main surface, and a sixth main surface opposite to the fifth main surface, and
in the direction perpendicular to the second main surface, a distance between the fourth main surface and the second main surface is shorter than a distance between the sixth main surface and the second main surface.

10. A silicon carbide semiconductor device comprising a silicon carbide substrate having a first main surface and a second main surface opposite to the first main surface, wherein
the silicon carbide substrate includes
a first impurity region having a first conductivity type,
a second impurity region provided on the first impurity region and having a second conductivity type different from the first conductivity type, and
a third impurity region provided on the second impurity region to be separated from the first impurity region, the third impurity region having the first conductivity type,
the first main surface is provided with a gate electrode trench and a gate runner trench,
the gate electrode trench is defined by a side surface and a bottom surface continuous to the side surface,
the side surface is constituted of the first impurity region, the second impurity region, and the third impurity region, and
the bottom surface is constituted of the first impurity region,
the silicon carbide semiconductor device further comprising:
a gate insulating film in contact with both the side surface and the bottom surface;
a first gate electrode provided on the gate insulating film;
a second gate electrode provided in the gate runner trench and electrically connected to the first gate electrode;
a first electrode in contact with the third impurity region at the first main surface;
a second electrode in contact with the second main surface; and
a gate runner provided on the second gate electrode, wherein
the silicon carbide substrate includes a fourth impurity region located between the gate runner trench and the second main surface, the fourth impurity region having the second conductivity type, the fourth impurity region being in contact with the gate runner trench.

11. A silicon carbide semiconductor device comprising a silicon carbide substrate having a first main surface and a second main surface opposite to the first main surface, wherein
    the silicon carbide substrate includes
        a first impurity region having a first conductivity type,
        a second impurity region provided on the first impurity region and having a second conductivity type different from the first conductivity type,
        a third impurity region provided on the second impurity region to be separated from the first impurity region, the third impurity region having the first conductivity type, and
        a fifth impurity region provided on the second impurity region, the fifth impurity region having the second conductivity type, the fifth impurity region having an impurity concentration higher than an impurity concentration of the second impurity region,
    the first main surface is provided with a gate electrode trench and a gate runner trench,
    the gate electrode trench is defined by a side surface and a bottom surface continuous to the side surface,
    the side surface is constituted of the first impurity region, the second impurity region, and the third impurity region, and
    the bottom surface is constituted of the first impurity region,
    the silicon carbide semiconductor device further comprising:
    a gate insulating film in contact with both the side surface and the bottom surface;
    a first gate electrode provided on the gate insulating film;
    a second gate electrode provided in the gate runner trench and electrically connected to the first gate electrode;
    a first electrode in contact with the third impurity region at the first main surface;
    a second electrode in contact with the second main surface; and
    a gate runner provided on the second gate electrode.

* * * * *